United States Patent

Suzuki

[11] 3,935,513
[45] Jan. 27, 1976

[54] PROTECTIVE CIRCUIT FOR TRANSISTOR AMPLIFIER

[75] Inventor: Tadao Suzuki, Tokyo, Japan

[73] Assignee: Sony Corporation, Tokyo, Japan

[22] Filed: July 8, 1974

[21] Appl. No.: 486,319

[30] Foreign Application Priority Data
July 12, 1973   Japan.................................. 48-78954

[52] U.S. Cl. .......... 317/31; 317/33 VR; 317/36 TD; 317/33 R; 317/41; 323/20; 330/207 P
[51] Int. Cl.² .......................................... H02H 7/20
[58] Field of Search .............. 317/31, 33 VR, 33 SC, 36 TD, 317/41, 46, 52; 323/20, 22 T; 330/207 P; 307/202

[56] References Cited
UNITED STATES PATENTS

| | | | |
|---|---|---|---|
| 3,493,878 | 2/1970 | Fautale............................ | 330/207 P |
| 3,522,480 | 8/1970 | Routh et al........................ | 317/41 X |
| 3,555,358 | 1/1971 | Gibbs ............................ | 330/207 P X |
| 3,646,397 | 2/1972 | Ruthenberg et al. ............. | 317/41 X |
| 3,681,659 | 8/1972 | Suzuki ............................ | 317/31 X |
| 3,703,679 | 11/1972 | Heidt........................... | 317/33 VR X |
| 3,731,153 | 5/1973 | Nishimoto....................... | 307/202 X |
| 3,792,313 | 2/1974 | Conrad......................... | 317/36 TD X |
| 3,794,858 | 2/1974 | Squiers......................... | 317/36 TD X |

*Primary Examiner*—William M. Shoop
*Assistant Examiner*—Patrick R. Salce
*Attorney, Agent, or Firm*—Hill, Gross, Simpson, Van Santen, Steadman, Chiara & Simpson

[57] ABSTRACT

A protective circuit for a transistor amplifier is disclosed which includes a load impedance detecting circuit provided between an output terminal of a transistor amplifier and a load terminal, a circuit for detecting an abrupt surge voltage of a voltage source for the amplifier and a muting circuit are provided between an input terminal of the amplifier and a reference point, the muting circuit being operative to limit an input signal applied to the input terminal of the amplifier in response to output signals of the load impedance detecting circuit. A protective circuit having a thermal sensing circuit for detecting a temperature rise of an output transistor above a predetermined level which shuts off the amplifier is described as one embodiment.

6 Claims, 8 Drawing Figures

PROTECTIVE CIRCUIT FOR TRANSISTOR AMPLIFIER

BACKGROUND OF THE INVENTION

1. Field of the Invention

This invention relates generally to a protective circuit for a transistor amplifier, and more particularly to a protective circuit for a transistor amplifier which operates without misoperation in the case of using a reactive load and operates in response to a load impedance and a surge voltage of a power supply voltage.

2. Description of the Prior Art

In the prior art, many protective circuit arrangements for a transistor amplifier have been disclosed which have a comparison circuit for comparing a load voltage and a load current, but they have an essential disadvantage in that they mis-operate in the case where the load is a reactive load. The characteristics of a typical prior art circuit will be described with reference to FIG. 1.

The limiting (protective) line of a prior art protective circuit can be generally expressed by, for example, a line $a$ for the output current I and output voltage V of the amplifier as shown in FIG. 1. In the case where the load is a pure resistor or nearly pure resistors for the above protective characteristics, the load line of such a protective circuit can be expressed by a line $b$ in FIG. 1 and hence the protective circuit performs a normal protective operation. In the case, however, where the load is, for example, a condenser-speaker which is rich in reactance components, the load line is expressed by an ellipse $c$ shown in FIG. 1 and the elliptic curve $c$ intersects the limiting line $a$. Thus, the protective circuit operates. However, in the latter case, even if the load line becomes the ellipse $c$, the ellipse $c$ exceeds the limiting line $a$ for a short time period.

SUMMARY OF THE INVENTION

Accordingly, it is an object of the present invention to provide a novel protective circuit for a transistor amplifier which protects the amplifier having a reactive load by providing a muting circuit which is operative to limit the input signal in response to the output signals across the load impedance reach a point which places a dangerous load on the amplifier or when an abrupt surge voltage occurs.

Another object of the present invention is to provide a protective circuit for a transistor amplifier which operates without misoperation in the case where a reactive load exceeds a desired maximum.

Yet another object of the present invention is to provide a protective circuit for a transistor amplifier which has a load impedance detecting circuit having a simple comparison circuit and an abrupt surge voltage detecting circuit of power supply voltage, and operates in response to the both outputs of the load impedance detecting circuit and the abrupt surge voltage detecting circuit.

A still further object of the present invention is to provide a protective circuit for a transistor amplifier which includes a load impedance detecting circuit, an abrupt voltage detecting circuit of a power supply voltage and thermal sensing circuit of an output transistor, and operates in response to each output of the detecting and sensing circuits.

Other objects, features and advantages of the present invention will be apparent from the following description taken in conjunction with the accompanying drawings.

DESCRIPTION OF THE PREFERRED EMBODIMENTS

Figure 1:
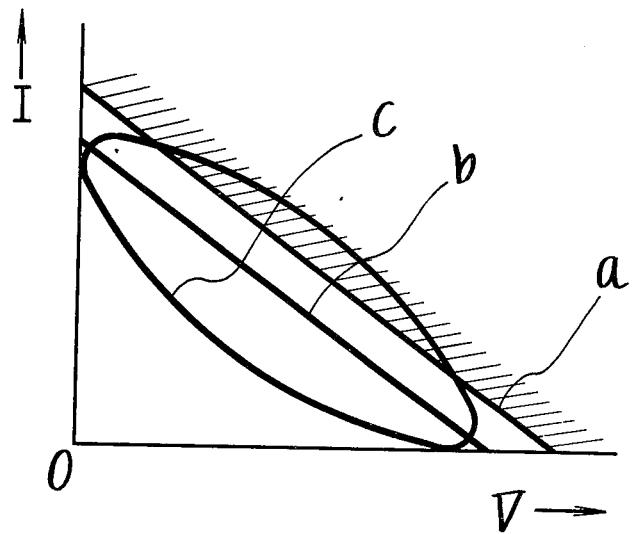
FIG. 1 is a graph showing a protective operation of a protective circuit of the prior art.

A protective circuit for a transistor amplifier will be hereinafter described with reference to the drawing.

Figure 2:
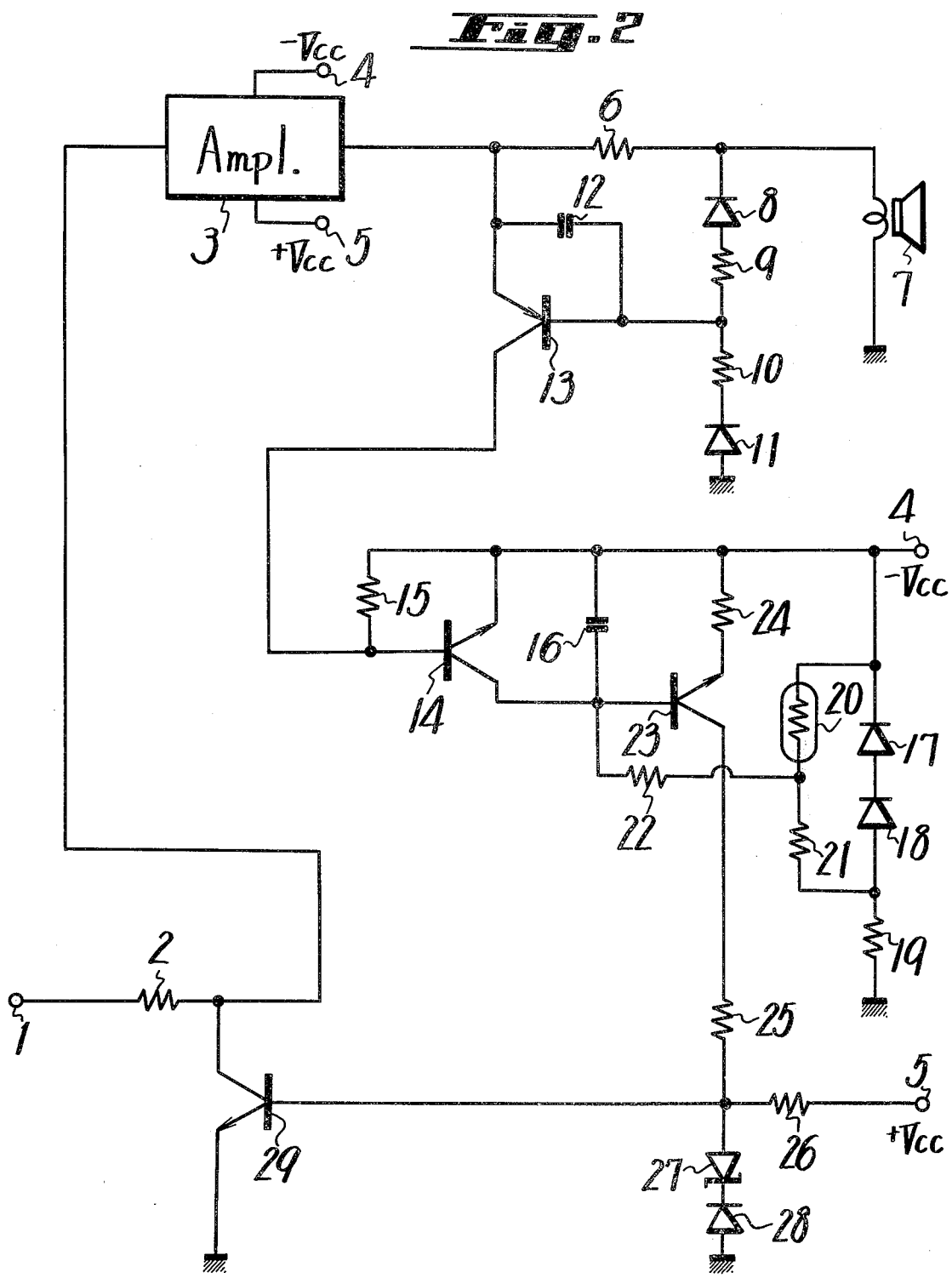
FIG. 2 is a circuit diagram showing an embodiment of the protective circuit for a transistor amplifier according to the present invention.

FIG. 2 is a circuit diagram showing an embodiment of the protective circuit for a transistor amplifier according to the present invention. In FIG. 2, reference numeral 1 indicates an input terminal which is supplied with a signal to be amplified and connected through a resistor 2 to the input terminal of a transistor amplifier 3. The amplifier 3 has connected thereto a voltage supply terminal 4, which is supplied with a negative voltage of −Vcc and a voltage supply terminal 5, which is supplied with a positive voltage of +Vcc and is driven by positive and negative voltages. The output terminal of the amplifier 3 is grounded through a resistor 6 and a load 7.

The connection point between the resistor 6 and the load 7 is connected to the cathode electrode of a diode 8 whose anode electrode is connected through resistors 9 and 10 to the cathode electrode of a diode 11 whose anode electrode is grounded. The connection point between the amplifier 3 and the resistor 6 is connected to one electrode of a capacitor 12 and to the emitter electrode of a PNP-type transistor 13. The other electrode of the capacitor 12 is connected to the connection point between the resistors 9 and 10 and to the base electrode of the transistor 13. The above circuit elements form a load impedance detecting circuit which will be described later.

The collector electrode of the transistor 13 is connected to the base electrode of an NPN-type transistor 14 whose emitter electrode is connected to the voltage supply terminal 4 of −Vcc through a resistor 15, and also to the base electrode of transistor 14. A capacitor 16 is connected in parallel to the emitter-collector path of the transistor 14. In this case, the resistor 15 is so selected in resistance value that when the transistor 13 is made ON (conductive), an output voltage from the amplifier 3 is dropped to bias the transistor 14 forwardly.

The voltage supply terminal 4 is connected to the cathode electrode of a diode 17 whose anode electrode is connected to the cathode electrode of a diode 18 whose anode is grounded through a resistor 19. A series circuit of a thermal sensitive element such as a thermistor 20 and a resistor 21 is connected between the cathode of the diode 17 and the anode of the diode 18 in parallel to these two series connected diodes. The connection point between the thermistor 20 and the resistor 21 is connected through a resistor 22 to the connection point between the collector of the transistor 14 and the capacitor 16. The capacitor 16 and the resistor 22 form a time constant circuit.

The connection point between the collector of the transistor 14 and the capacitor 16 is connected to the base electrode of an NPN-type transistor 23 whose emitter electrode is connected through a resistor 24 to the voltage supply terminal 4 and whose collector electrode is connected through resistors 25 and 26 to the voltage supply terminal 5 of +Vcc. The connection point between the resistors 25 and 26 is connected to the anode electrode of a Zener diode 27 whose cathode electrode is connected to the cathode electrode of a diode 28 whose anode electrode is grounded. The connection point between the resistors 25 and 26 is further connected to the base electrode of an NPN-type transistor 29 whose collector electrode is connected to the connection point between the resistor 2 and the amplifier 3 and whose emitter electrode is grounded.

With the protective circuit of the present invention constructed as above, when a signal is applied to the input terminal 1 and negative and positive voltages are applied to the voltage source terminals 4 and 5, respectively, the voltage difference across the capacitor 12 is low and the transistor 13 is in an OFF-state (nonconductive). Accordingly, no voltage is applied to the base of the transistor 14 and hence the transistor 14 is in OFF-state. As a result, the terminal voltage across the capacitor 16 is raised gradually to a predetermined divided voltage by the series circuit of the thermistor 20 and resistor 21 in accordance with the time constant circuit consisting of the capacitor 16 and the resistor 22, and then reached to a forward bias voltage for the transistor 23 after a constant time delay from the application of the power source voltage to make the transistor 23 conductive. Thus, the base of the transistor 29 is supplied with the negative voltage from the voltage supply terminal 4 through the transistor 23. However, the transistor 29 is supplied with only the positive voltage from the voltage supply terminal 5 for a time period corresponding to the time period of the time constant circuit consisting of the capacitor 16 and resistor 22, and hence is made conductive. Thus, the signal applied to the input terminal 1 is muted thereby and is prevented from being applied to the amplifier 3. After the predetermined time period has lapsed, the transistor 23 becomes conductive and then the transistor 29 is supplied with the negative voltage from the voltage supply terminal 4. When a predetermined negative Zener voltage determined by the Zener diode 27 is applied to the transistor 29, it becomes nonconductive. Thus, the signal applied to the input terminal 1 is applied to the amplifier 3. The above time constant circuit can be inserted in the base-emitter path of the transistor 14.

With the protective circuit according to the present invention, since the input signal is applied to the amplifier 3 after the predetermined constant time period upon the application of the power source voltage, an undesired pop noise can be avoided at the time when the power source voltage is applied, and also an electric shock to a pre-amplifier can be also avoided.

The load impedance detecting circuit in FIG. 2 will be now described. As described above, after the predetermined time period has elapsed from the supply of the power source voltage, the transistor 29 becomes nonconductive and the amplifier 3 is supplied with the input signal to produce an output signal for driving the load 7. If it is assumed that the output current from the amplifier 3 or that flowing to the load 7 through the resistor 6 is taken as $i_o$, the load voltage across the load 7 as $e_o$, and the resistance values of the resistors 6, 9 and 10 as $R_1$, $R_2$ and $R_3$, respectively, the equivalent circuit of the circuit portion formed of the resistors 6, 9 and 10, the diodes 8 and 11, the capacitor 12 and the load 7 in FIG. 2 can be shown in FIG. 3A. That is, the resistor 6 is shown as a voltage source 6' with an electromotive force or a voltage of $i_o R_1$ and the load 7 is shown as a voltage source 7' with a voltage of $e_o$. Thus, the capacitor 12 is charged up by the output from the voltage source 6' and discharged by the output from the voltage source 7'. In other words, the voltages $i_o R_1$ and $e_o$ are subjected to a peak-value-rectification by the diodes 8 and 11 and supplied to the capacitor 12 in opposite polarities.

Figure 3A:
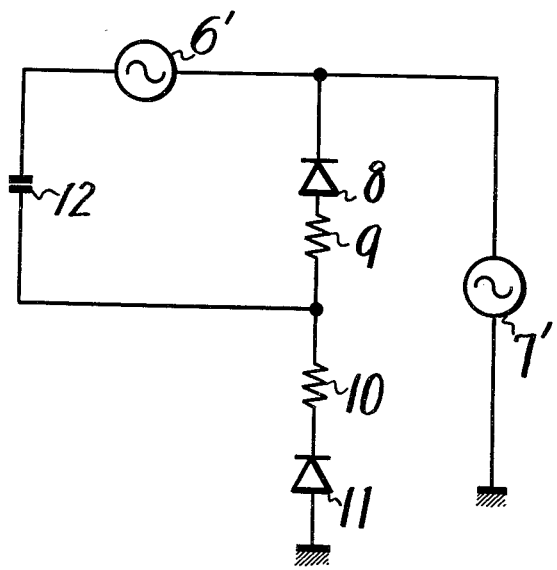
FIG. 3A and FIG. 3B are circuit diagrams each showing a basic circuit of the load impedance detecting circuit according to the present invention.
Figure 3B:
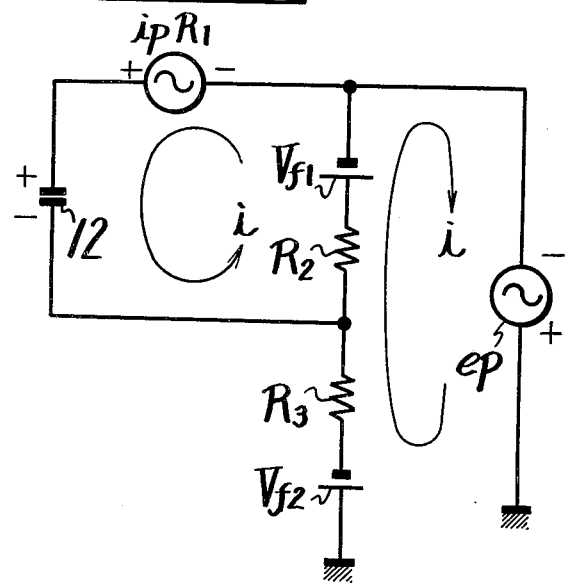

If the forward resistances of the diodes 8 and 11 are neglected and their forward voltage drops are taken as $V_{f1}$ and $V_{f2}$, the equivalent circuit shown in FIG. 3A can be shown as another form of an equivalent circuit in FIG. 3B. That is, a charging current $i$ flows through the capacitor 12 by a voltage $i_p R_1$ (where $i_p$ represents the peak value) produced in a positive half cycle of the output signal to charge up the capacitor 12 with the polarity shown in FIG. 3B. Accordingly, a terminal voltage $V$ across the capacitor 12 can be expressed by the following equation (1):

$$V = i_p \cdot R_1 - V_{f1} - i \cdot R_2 \qquad (1)$$

During a negative half cycle of the output signal, due to a load voltage $e_p$ (peak value) a current $i$ flows through the closed loop including the resistors $R_2$ and $R_3$ and the voltage source $e_p$ in the direction shown in FIG. 3B. In fact, since the latter current $i$ flows in the direction to reduce the charging current $i$, the latter current $i$ substantially serves as the discharging current for the capacitor 12. If it is assumed that the charging and discharging currents $i$ are in balanced state, the following equation (2) is obtained for the closed loop including the elements $e_p$, $R_2$ and $R_3$.

$$e_p = V_{f1} + V_{f2} + (R_2 + R_3) i \qquad (2)$$

From the equations (1) and (2), the following equation is derived by cancelling the current $i$.

$$V = i_p \cdot R_1 - V_{f1} - \frac{R_2}{R_2 + R_3}(e_p - V_{f1} - V_{f2}) \qquad (3)$$

When the voltage $V$ expressed by the above equation (3) exceeds the voltage drop $V_{BE}$ across the base-emitter of the transistor 13, the transistor 13 becomes conductive to produce an excessive or over load detecting signal.

If the equation (3) is rewritten on the assumption of $V = V_{BE}$, the following equation (4) is derived.

$$i_p = \frac{R_2}{R_1} \cdot \frac{e_p}{R_2 + R_3} + \frac{V_{BE}}{R_1} + \frac{R_3}{R_1} \cdot \frac{V_{f1}}{R_2 + R_3} - \frac{R_2}{R_1} \cdot \frac{V_{f2}}{R_2 + R_3} \qquad (4)$$

Where, let it be assumed that $$\frac{V_{BE}}{R_1} + \frac{R_3}{R_1} \cdot \frac{V_{f1}}{R_2+R_3} - \frac{R_2}{R_1} \cdot \frac{V_{f2}}{R_2+R_3} = \frac{K}{R_1} \ \& \ \frac{e_p}{i_p} = Z.$$

In other words, the voltages $i_o R_1$ and $e_o$ are subjected to a peak-value-rectification by the diodes 8 and 11 and converted to a DC voltage by the capacitor 12, so that the terminal voltage V across the capacitor 12 becomes irrespective of the phase difference between the current $i_o$ and the voltage $e_o$ and becomes to a value depending upon with the peak values $i_p$ and $e_p$. Thus, the factor $Z = i_p/e_p$ shows not only the pure resistance component of the load 7, but also its impedance component.

If the factors Z and $R_1/K$ are used, the equation (4) can be rewritten as follows:

$$i_p = \frac{K}{R_1 - \dfrac{R_2 \cdot Z}{R_2 + R_3}} \quad (5)$$

From the equation (5), the value of the load impedance Z for satisfying the condition $i_p = \alpha(Z\alpha)$ is expressed as follows:

$$Z\alpha \ \frac{R_1 (R_2 + R_3)}{R_2} \quad (6)$$

When the load impedance Z is greater than that $Z\alpha$ obtained by the equation (6), the current $i_p$ becomes negative and hence the transistor 13 is not made conductive. However, in the case where the load impedance Z is smaller than the value $Z\alpha$, when the current $i_p$ becomes greater than that obtained by the equation (5), the transistor 13 is made conductive to produce the excessive load detecting signal.

Figure 4:
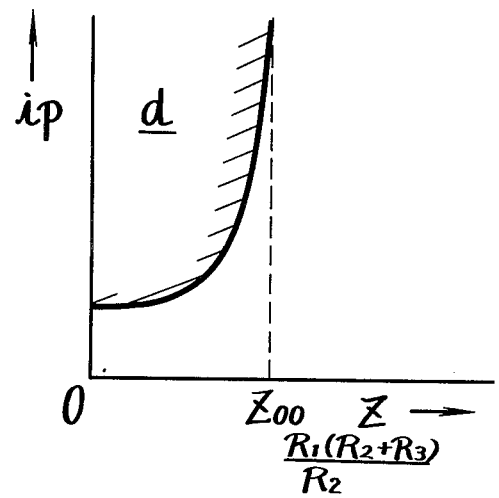
FIG. 4 through FIG. 6 are graphs used for explanation of the present invention.

If the equation (5) is shown in a graph, FIG. 4 is obtained. In the graph of FIG. 4, a region d is such a region that the transistor 13 becomes conductive to produce the over-load detecting signal.

Figure 5:
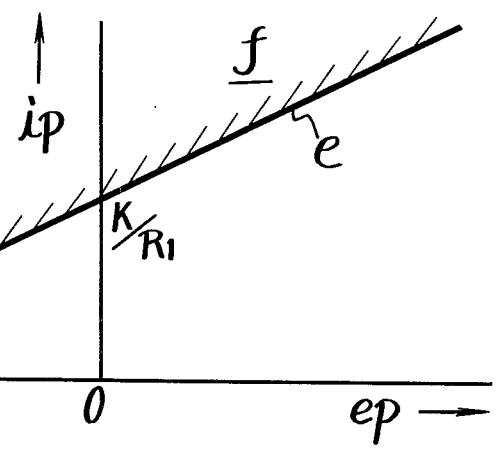

If the equation (4) is shown in a graph, FIG. 5 is obtained. When the load 7 is a pure resistor, the transistor 13 becomes conductive in a region f to produce the over load detecting signal.

Figure 6:
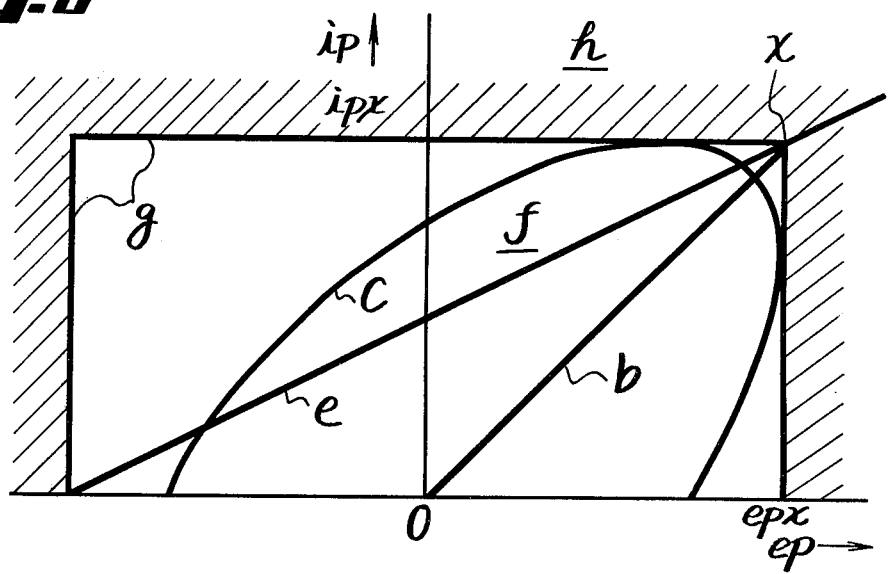

When the load 7 is an impedance load, a bent line g in FIG. 6 is a limiting line apparently and a region h is a limiting region. That is, the terminal voltage V of the capacitor 12 becomes to such one as has a relation with the peak current $i_p$ and peak voltage $e_p$, so that if a load line ($e_p$ versus $i_p$ characteristic) is shown by a line b in FIG. 6 in the case where a pure resistor equal to the impedance of the impedance load is a load, a current $i_{px}$ and a voltage $e_{px}$ of the current $i_p$ and the voltage $e_p$ at the crossing point X between the line b and the limiting line e show a region from which an output can be deribed. When the load is the impedance load, its load line becomes to an ellipse c (in FIG. 6, only a positive half cycle portion is shown). Thus, even if the load line c intersects the limiting line e, no protective action is achieved. Only when the ellipse c intersects the bent line g, the transistor 13 becomes conductive. Accordingly, even if there is a phase difference between a load voltage and a load current as in the case of a reactive load, no error operation is carried out, but only when the load impedance is lower than a predetermined value (for example, 1 Ω) as short-circuited, the over load detecting signal is obtained.

When the load becomes an over load exceeding the above mentioned set value and the transistor 13 becomes conductive to produce an over load detecting signal, the over load detecting signal is applied to the base of the transistor 14. As a result, the voltage difference across the base-emitter of the transistor 14 increases to be biased in the forward direction and then the transistor 14 becomes conductive. Thus, the capacitor 16 is short-circuited through the transistor 14 to discharge its charge stored therein, and consequently the transistor 23 becomes nonconductive. Thereafter, the transistor 29 becomes conductive as in the case of the supply of the source voltage to cut off the input signal to the amplifier 3 and hence the amplifier 3 becomes free from an over load.

At the time when the over load state is released, the terminal voltage across the capacitor 12 is lowered, the transistor 13 becomes nonconductive to cut off the supply of the voltage to the base of the transistor 14 and then the transistor 14 becomes nonconductive again. However, since the capacitor 16 is discharged, the transistor 23 is not biased in the forward direction and is made conductive after the constant time period due to the time constant circuit formed of the capacitor 16 and the resistor 22 as in the case of the supply of the source voltage. Thus, the transistor 29 becomes nonconductive to apply the input signal to the amplifier 3 again.

When the normal over load protective operation is achieved due to a continuous over load condition, heat may be accumulated in the interior of the amplifier 3 or the temperature of the amplifier 3 in its interior becomes high due to the undesirable conditions of use and there may occur damage to the amplifier 3. In such a case, the resistance value of the thermistor 20 decreases and hence the voltage at the connection point between the thermistor 20 and the resistor 21 becomes low. Thus, the base voltage of the transistor 23 is lowered and hence the transistor 23 becomes nonconductive. As a result, the transistor 29 is made conductive as in the case of the supply of the source voltage to mute the input signal. In this case, the muting for the input signal is performed irrespective of the time constant circuit and after the amplifier 3 is made free from the above mentioned heated state, the input signal is again applied to the amplifier 3.

With the protective circuit for a transistor amplifier of the present invention, a pop noise upon the supply of a source voltage and a shock for a pre-amplifier can be avoided. Further, when the amplifier 3 bears an excessive load, an input signal is automatically prevented from being applied to the amplifier 3 so as to avoid the damage of the amplifier 3 and hence to protect the circuit. In this case, since the input signal is again applied to the amplifier 3 after the predetermined time interval, there is no manual reset required. During the time interval within which the time constant circuit is operative, the over load condition is improved. In the case where the over load condition continues for a certain time interval, the above protective operation is immediately carried out repeatedly to control the supply of the input signal to the amplifier in a repeated manner. In addition, the protective operation is immediately carried out repeatedly to control the supply of the input signal to the amplifier in a repeated manner. In addition, the protective operation for an over load according to the invention is carried out for the case where the load 7 is a reactive impedance without an error operation to protect the amplifier from an over load positively. In the case of a thermal over load, the input signal is automatically cut off and after the over load state is finished, the input signal is applied. Not only in the case where a thermal over load results from internal causes such as a continuous over load, but also in the case where it results from external causes, such as the state of use, the input signal is cut off to prevent the amplifier 3 from being destroyed. Further, due to the employment of a switching element, the response time interval becomes short, so that the protective action is very good. In addition, the avoidance of a pop noise and the protective operation for electric and thermal over load are performed by one circuit, so that the parts of the circuit are small in number.

Figure 7:
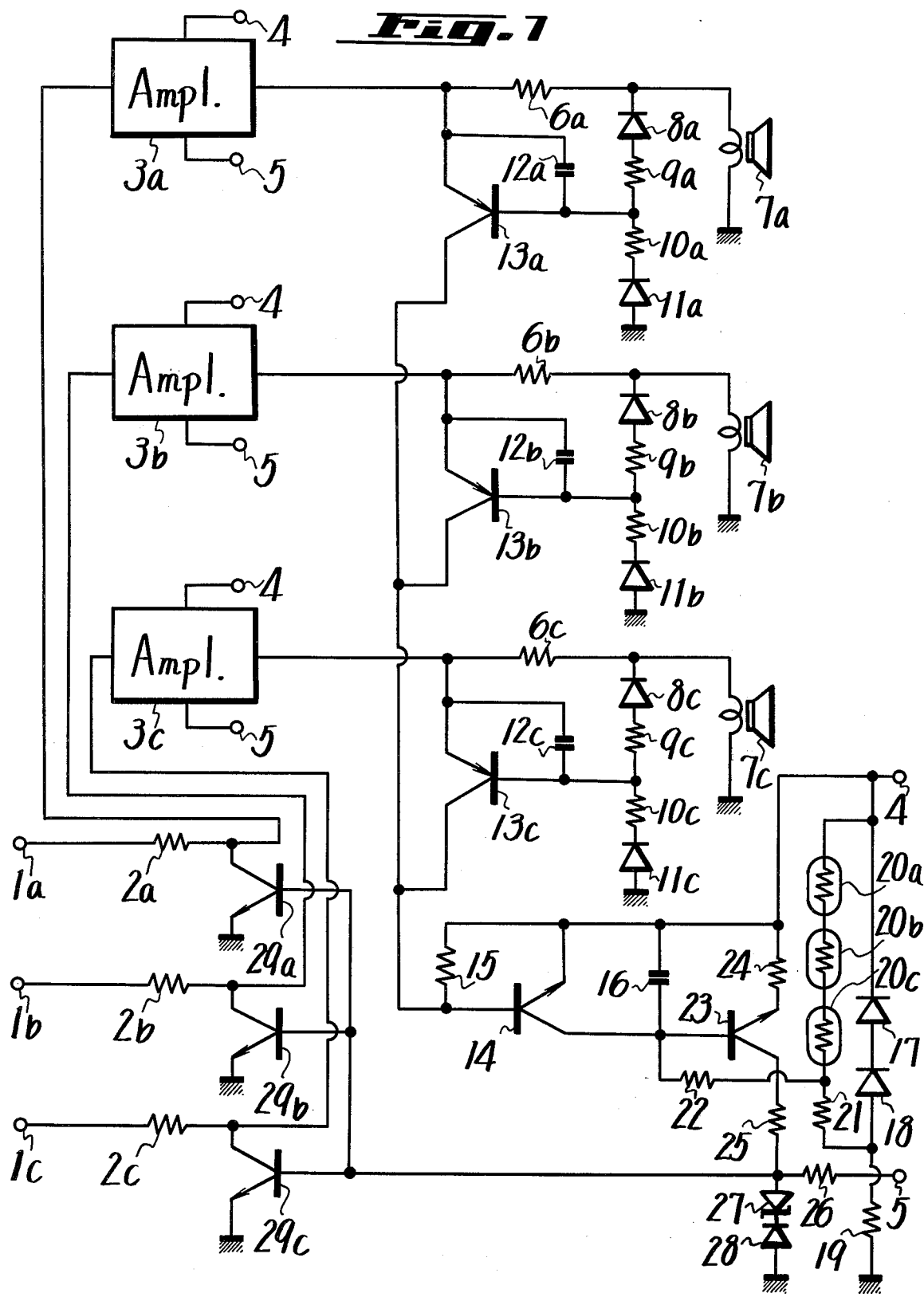
FIG. 7 is a circuit diagram showing another embodiment of the protective circuit for a transistor amplifier according to the present invention.

FIG. 7 shows an embodiment in which the protective circuit for a transistor amplifier according to the present invention is adapted to a multi-channel amplifier such as a four-channel stero or the like. In FIG. 7, reference numerals similar to those used in FIG. 2 show similar elements and their description will be omitted.

In the embodiment of FIG. 7, signal input terminals 1a, 1b and 1c are connected through resistors 2a, 2b and 2c to amplifiers 3a, 3b and 3c each of which has connected thereto negative and positive voltage sources 4 and 5. Output terminals of the amplifiers 3a, 3b and 3c are grounded through resistors 6a, 6b and 6c and loads 7a, 7b and 7c respectively. The connection points between the resistors 6a to 6c and the loads 7a to 7c are grounded through series circuits of diodes 8a, 8b, 8c, resistors 9a, 9b, 9c and 10a, 10b, 10c and diodes 11a, 11b and 11c, respectively. The connection points between the resistors 9a to 9c and the resistors 10a to 10c are connected to the connection points between the amplifiers 3a to 3c and the resistors 6a to 6c through capacitors 12a, 12b, 12c, respectively. The base and emitter electrodes of PNP-type transistors 13a, 13b and 13c are connected to both the terminals of the capacitors 12a to 12c, respectively. The collector electrodes of the transistors 13a to 13c are connected to the base electrode of the transistor 14. The collector electrode of the transistor 23 is connected through the resistor 25 to the base electrodes of transistors 29a to 29c whose emitter electrodes are grounded, respectively, and whose collector electrodes are connected to the connection points between the amplifiers 3a to 3c and resistors 2a to 2c, respectively. The series circuit of thermistors 20a, 20b and 20c is connected between the resistor 21 and the cathode electrode of the diode 17, and the thermistors 20a to 20c are coupled to the amplifiers 3a to 3c, respectively, from the thermal point of view. The other circuit constructions are substantially the same as those of FIG. 2. In the embodiment shown in FIG. 7, if the amplifiers 3a to 3c are the same in thermal characteristics, a single thermistor could be enough instead of the three thermistors 20a to 20c.

With the embodiment shown in FIG. 7, when any one of the three amplifiers 3a to 3c begins to bear an over load, all input signals to the three amplifiers 3a to 3c are cut off at the same time. Further, since, in the embodiment of FIG. 7, the transistors 14, 23, the capacitor 16, the resistors 15, 21, 22, 24, 25, 26, the diodes 17, 18, 28, the Zener diode 27, and the source voltages, 4, 5, which are the main part, are used common, the present invention is advantageous for a multi-channel system.

It may be obvious that the embodiment of FIG. 7 can achieve the same effect as that of FIG. 2.

It will be apparent that many modifications and variations can be effected by those skilled in the art without departing from the spirit and scope of the novel concepts of the present invention.

I claim as my invention:

1. A transistor amplifier protective circuit comprising:
   an input terminal supplying an input signal to said transistor amplifier,
   a first transistor with its emitter-collector electrodes connected between ground and said input terminal to short said input signal to ground when said first transistor conducts,
   a first resistor with one side connected to the output of said transistor amplifier, a load connected between ground and the other side of said first resistor,
   second and third transistors with the collectoremitter path of said second transistor connected between the output of said transistor amplifier and the control electrode of said third transistor,
   a first capacitor connected between the control electrode of said second transistor and the output of said transistor amplifier,
   a fourth transistor with its control electrode connected to the emitter-collector path of said third transistor,
   a bias voltage of a first polarity, and the emitter-collector path of said fourth transistor connected between the control electrode of said first transistor and said bias voltage of a first polarity,
   a second capacitor connected between said bias voltage of a first polarity and the control electrode of said fourth transistor,
   a second resistor connected between ground and the control electrode of said fourth transistor,
   a third resistor connected between the other side of said first resistor and the control electrode of said second transistor, and
   a fourth resistor connected between ground and the control electrode of said second transistor.

2. A transistor amplifier protective circuit according to claim 1 further including a first diode connected between said first and third resistors, a second diode connected between ground and said fourth resistor and said first and second diodes poled to pass current in the same direction.

3. A transistor amplifier protective circuit according to claim 2 including a Zener diode connected between ground and the control electrode of said first transistor, and a bias voltage of a second polarity connected to said control electrode of said first transistor.

4. A transistor amplifier protective circuit according to claim 3 including a thermistor connected between said bias voltage of a first polarity and a tap point on said second resistor.

5. A transistor amplifier protective circuit according to claim 1 including a second transistor amplifier, a second input terminal supplying an input to said second transistor amplifier, a fifth transistor with emitter-collector electrodes connected between ground and said second input terminal and its control electrode connected to the control electrode of said first transistor, a sixth resistor with one side connected to the output of said second transistor amplifier, a second load connected between ground and the other side of sixth resistor, a sixth transistor with its emitter-collector electrodes connected between the control electrode of said third transistor and the first side of said sixth resistor, and a third capacitor connected between the control electrode of said sixth transistor and said first side of said sixth resistor.

6. A transistor amplifier protective circuit according to claim 5 including a fourth diode, a seventh resistor, an eighth resistor and a fith diode connected in series between ground and the second side of said sixth resistor, and the control electrode of said sixth transistor connected to the junction point between said seventh and eighth resistors.

* * * * *